United States Patent
Anand et al.

(10) Patent No.: US 7,093,206 B2
(45) Date of Patent: Aug. 15, 2006

(54) COMPUTER AIDED DESIGN METHOD AND APPARATUS FOR MODELING AND ANALYZING ON-CHIP INTERCONNECT STRUCTURES

(75) Inventors: Minakshisundaran B. Anand, Germantown, MD (US); Matthew S. Angyal, Stormville, NY (US); Alina Deutsch, Chappaqua, NY (US); Ibrahim M. Elfadel, Ossining, NY (US); Gerard V. Kopcsay, Yorktown Heights, NY (US); Barry J. Rubin, Croton-on-Hudson, NY (US); Howard H. Smith, Beacon, NY (US)

(73) Assignee: International Business Machines Corp., Armonk, NY (US)

( * ) Notice: Subject to any disclaimer, the term of this patent is extended or adjusted under 35 U.S.C. 154(b) by 212 days.

(21) Appl. No.: 10/690,238

(22) Filed: Oct. 21, 2003

(65) Prior Publication Data

US 2005/0086615 A1    Apr. 21, 2005

(51) Int. Cl.
*G06F 17/50* (2006.01)
(52) U.S. Cl. ............................................. 716/1; 703/14
(58) Field of Classification Search .................... 716/9, 716/1; 703/14
See application file for complete search history.

(56) References Cited

U.S. PATENT DOCUMENTS 5,610,833 A      3/1997   Chang et al.
6,051,027 A *    4/2000   Kapur et al. ................. 703/5
6,342,823 B1     1/2002   Dansky et al.
6,418,401 B1     7/2002   Dansky et al.
6,665,849 B1 *  12/2003   Meuris et al. ................ 716/7
2003/0131334 A1* 7/2003   Suaya et al. ................. 716/12
2004/0078176 A1* 4/2004   Bowen et al. ............... 703/14

OTHER PUBLICATIONS

Alina Deutsch et al., On-Chip Wiring Design Challenges for Gigahertz Operation, Apr. 1, 2001.

* cited by examiner

*Primary Examiner*—Thuan Do
*Assistant Examiner*—Naum Levin
(74) *Attorney, Agent, or Firm*—Law Office of Charles W. Peterson, Jr.; Louis J. Percello, Esq.; Satheesh K. Karra, Esq.

(57) ABSTRACT

A computer aided design (CAD) system. A template generation engine generates templates from interconnect configuration files. A field solver generates high frequency passive element relationships from the templates. A circuit builder generates circuit description files from device technology models and from high frequency passive element relationships. Parameterized circuit description models may be generated for large range of sensitivity analyses. A simulator simulates circuit responses for transmission line models from the circuit description files. Interconnect configuration files may be generated by a geometry and material definition module that receives process description data from a designer.

28 Claims, 13 Drawing Sheets

FIG. 3A

Calculate 2D capacitances

Variables | Calculation options

Variable choices

Calculate for several layers using default values

Specify signal wire layer and set variables

Signal wire in layer: [M4]  Layer list: M3, M4, MJ

Variable in layer: [M4]

Parameter: [Signal line space]

- ● Single value [0.1]
- ● List (comma separated) [0.1 ,]
- ● Range
  From: [0.1] To: [ ] Step: [ ]

- ○ Keep pitch constant
- ● Vary width and space by the ratio
- ● Treat width and space as independent Variable List: M4 Signal line width 0.45

[Add] [Remove]

Variation choices
- ⊙ Treat variables as independent
- ○ Vary simultaneously
- ○ Simulate full matrix

[Help]  [Start]  [Cancel]

~134

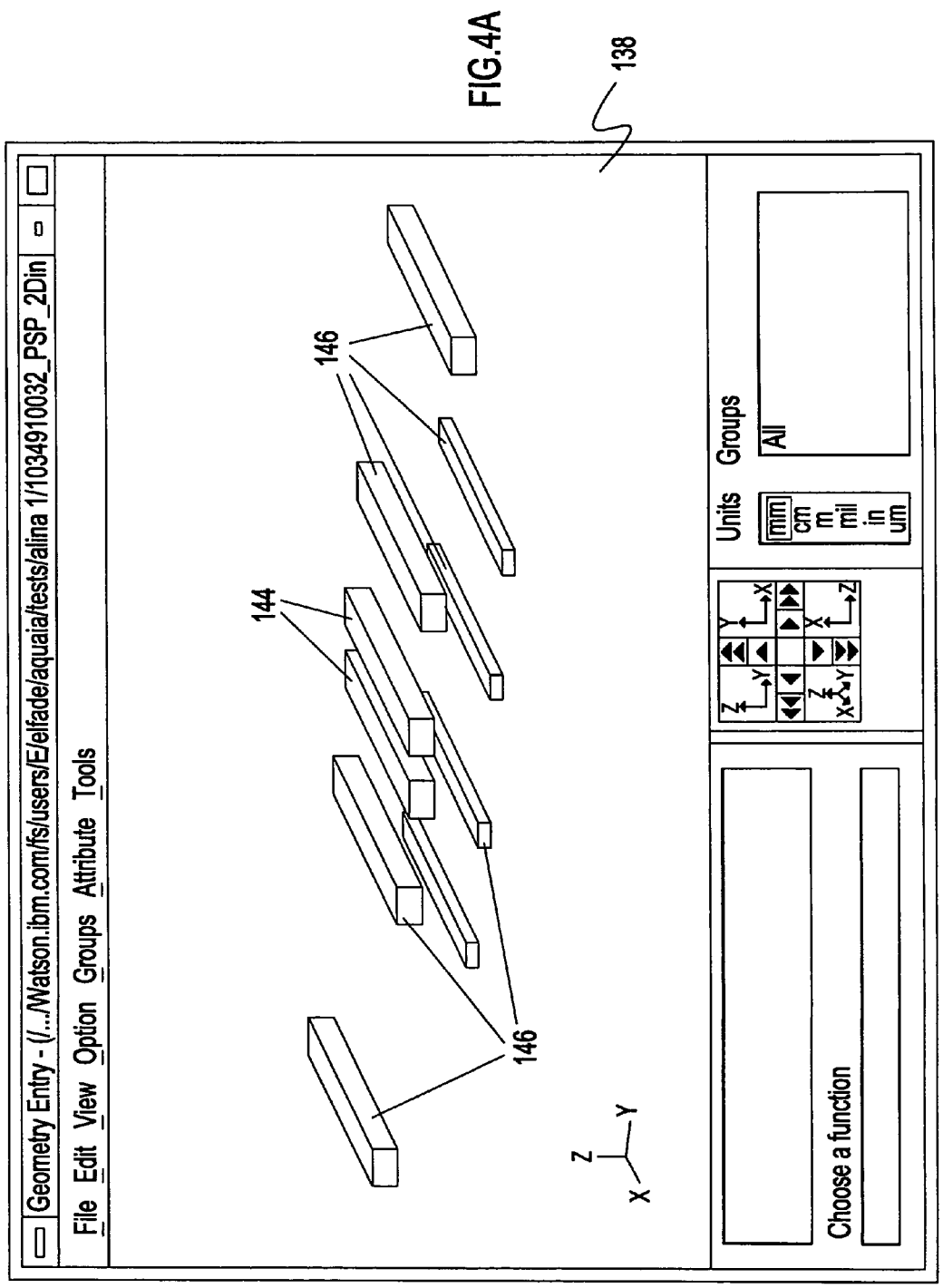

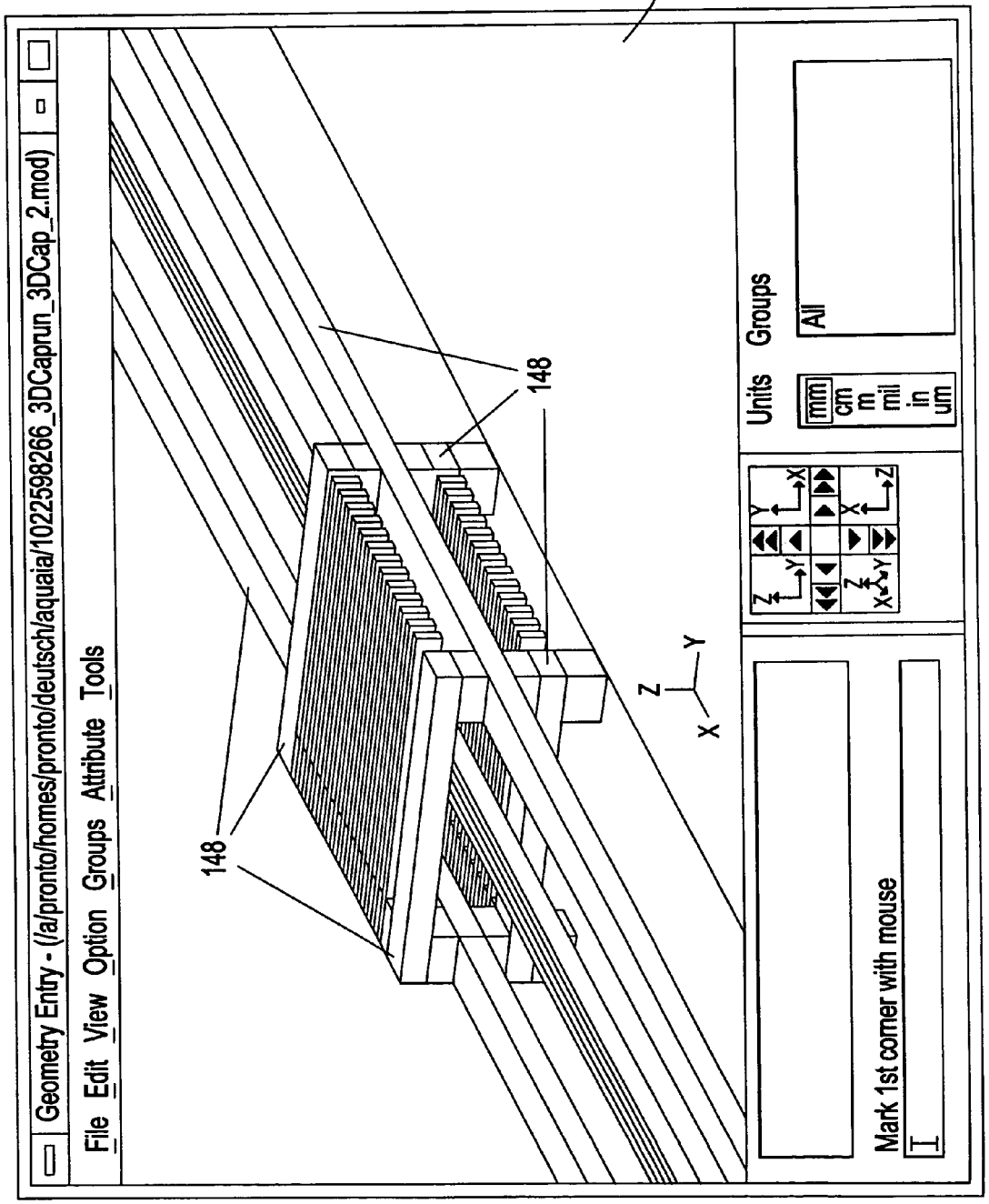

Run 1 --- 3D Capacitance results

File

Outputting for wire : 1
Outputs : C components
Grid density : 2
Calculation files will be retained in current directory after calculation
Prefix for all calculation files will be 1029534872

Start time : Fri Aug 16 17 : 54 : 32
*************

| Layer | Capacitance for wire 1 | | | |
|---|---|---|---|---|
| | 2D C11 (pf/cm) | 3D C11 (pf/cm) | 2D C12 (pf/cm) | 3D C12 (pf/cm) |
| M1 over MCBAR under M2 | 3.0504200 | 2.7537084 | 1.6507100 | 1.6846815 |
| M2 over M1 under M3 | 1.7485900 | 1.3858953 | 0.2129690 | 0.2621409 |
| M3 over M2 under M4 | 1.8642900 | 1.3124039 | 0.1920960 | 0.2936098 |
| M4 over M3 under M5 | 1.8635200 | 1.4716420 | 0.1968970 | 0.2512934 |
| M5 over M4 under M6 | 1.6209000 | 1.3226274 | 0.5730250 | 0.5830435 |
| M6 over M5 under MJ | 1.4638100 | 1.2693424 | 0.6260030 | 0.6137536 |
| MJ over M6 under MK | 1.5905600 | 1.4474548 | 0.6061480 | 0.6350585 |
| MK over MJ under MP | 1.5972100 | 1.4036189 | 0.6043900 | 0.6395814 |
| MP over MK under 4x fatwire - 1 | 1.5996799 | 1.4704876 | 0.7050640 | 0.7387674 |
| 4X fatwire - 1 over MP under 4X fatwire - 2 | 1.8839900 | 1.7900904 | 0.6782680 | 0.6954582 |
| 4X fatwire - 2 over 4X fatwire - 1 under 6X fatwire - 1 | 1.7640200 | 1.6919317 | 0.7267550 | 0.7439273 |
| 6X fatwire - 1 over 4X fatwire - 2 under fatwire - 2 | 1.7833500 | 1.8086258 | 0.6874850 | 0.6943144 |
| 6X fatwire - 2 over 6X fatwire - 1 | 1.6029400 | 1.7142167 | 0.8189310 | 0.7884333 |

The full 3D capacitance matrix is shown in 1029534872_3DCaprun_3DCap.matrix

Calculation finished successfully.
End time : Fri Aug 16 23 : 47 : 17

COMPUTER AIDED DESIGN METHOD AND APPARATUS FOR MODELING AND ANALYZING ON-CHIP INTERCONNECT STRUCTURES

BACKGROUND OF THE INVENTION

1. Field of the Invention

The present invention is related to circuit design systems and more particularly to computer aided design (CAD) systems for designing integrated circuits (ICs) operating over a wide frequency band and with circuit interconnects that might experience transmission line effects.

2. Background Description

Sets of software programs are well known in the art as computer aided design (CAD) tools. Typical CAD tools include automatic layout tools, timing analysis tools, logic synthesis tools, and so forth. In addition, a CAD tool may include electromagnetic (EM) field solvers (also known as parameter extractors) and circuit simulators for circuit conductor (interconnect) analysis and design. Integrated circuit (IC) designers have found CAD tools invaluable for designing, analyzing and verifying complex ICs and IC chip designs, such as microprocessors, microcontrollers, communications circuits and the like.

Providing an acceptable wide-band conductor description requires an accurate description of the particular conductor, e.g., its geometry and construction materials. This information may be available to the semiconductor process technologist but usually is not passed to the circuit designer. Instead, the circuit designer receives a set of ground rules that describes a range of results based on those conductor properties, e.g., capacitance/resistance/inductance per unit length or per unit area. These lump values at best provide rule of thumb design guidance and do not lend themselves to accurate wide-band electrical circuit characterizations of high-performance electrical interconnect structures.

Designers have used EM field solvers to compute conductor electrical properties, such as capacitance and inductance, from conductor geometric and physical specifications. Then, the designer can use the EM field solver results in a circuit simulator to simulate the transient or AC response, i.e., how the particular circuit devices connected by and driving the conductors respond to excitatory input signals. The excitatory input signals can be modeled to include either or both wanted and unwanted input signals, e.g., a driving logical signal such as from another such circuit, and noise signals, such as electromagnetic interference from the neighboring conductors and/or coupled noise from adjacent lines (cross talk).

For circuit signal stability the circuit model must have a valid low frequency or DC response, as well as an acceptable very high frequency transient response, e.g., to 100 GigaHertz (100 GHz) and beyond. This complicates circuit design because in addition to active element models that are accurate over the expected operating frequency range, either the circuit model must somehow accommodate wide-band models for on-chip conductors or different conductor models must be employed at each of a number of points across the frequency spectrum to accommodate the full range of conductor characteristics. Modeling conductors across this range requires a very-high level of expertise in computational models for electromagnetism that even the best IC designers do not normally have. See, e.g., Alina Deutsch et al., "On-Chip Wiring Design Challenges for Gigahertz Operation," *Proceedings of The IEEE*, Vol. 89, No. 4, April 2001, pp. 529–555.

Thus, there is a need for electrical circuit conductor descriptions that are valid over a very wide range of operating frequencies and in particular there is a need for such conductor descriptions in circuit design.

SUMMARY OF THE INVENTION

It is a purpose of the invention to facilitate electrical circuit interconnect design for optimal circuit performance;

It is another purpose of the invention to bridge the gap between semiconductor process information and semiconductor circuit design information;

It is yet another purpose of the invention to provide IC designers with the most accurate semiconductor process parameter descriptions;

It is yet another purpose of the invention to avail integrated circuit (IC) designers with the best available expertise and practices of computational electromagnetism for interconnect modeling and analysis.

The present invention relates to a computer aided design (CAD) system. A template generation engine generates templates from interconnect configuration files. A field solver generates wide band passive element relationships from the templates. A circuit builder generates circuit description files from device technology models and from wide band passive element relationships. A simulator simulates circuit responses for transmission line models from the circuit description files. Interconnect configuration files may be generated by a geometry and material definition module that receives process description data from a designer.

BRIEF DESCRIPTION OF THE DRAWINGS

The foregoing and other objects, aspects and advantages will be better understood from the following detailed description of a preferred embodiment of the invention with reference to the drawings, in which:

FIGS. 3A–B show screenshot panel examples for 2D and 3D capacitance calculation, respectively;

FIGS. 4A–B show screenshot panel examples for 2D and 3D templates;

FIG. 4C shows a capacitance calculation screenshot panel example;

DESCRIPTION OF PREFERRED EMBODIMENTS

Figure 1:
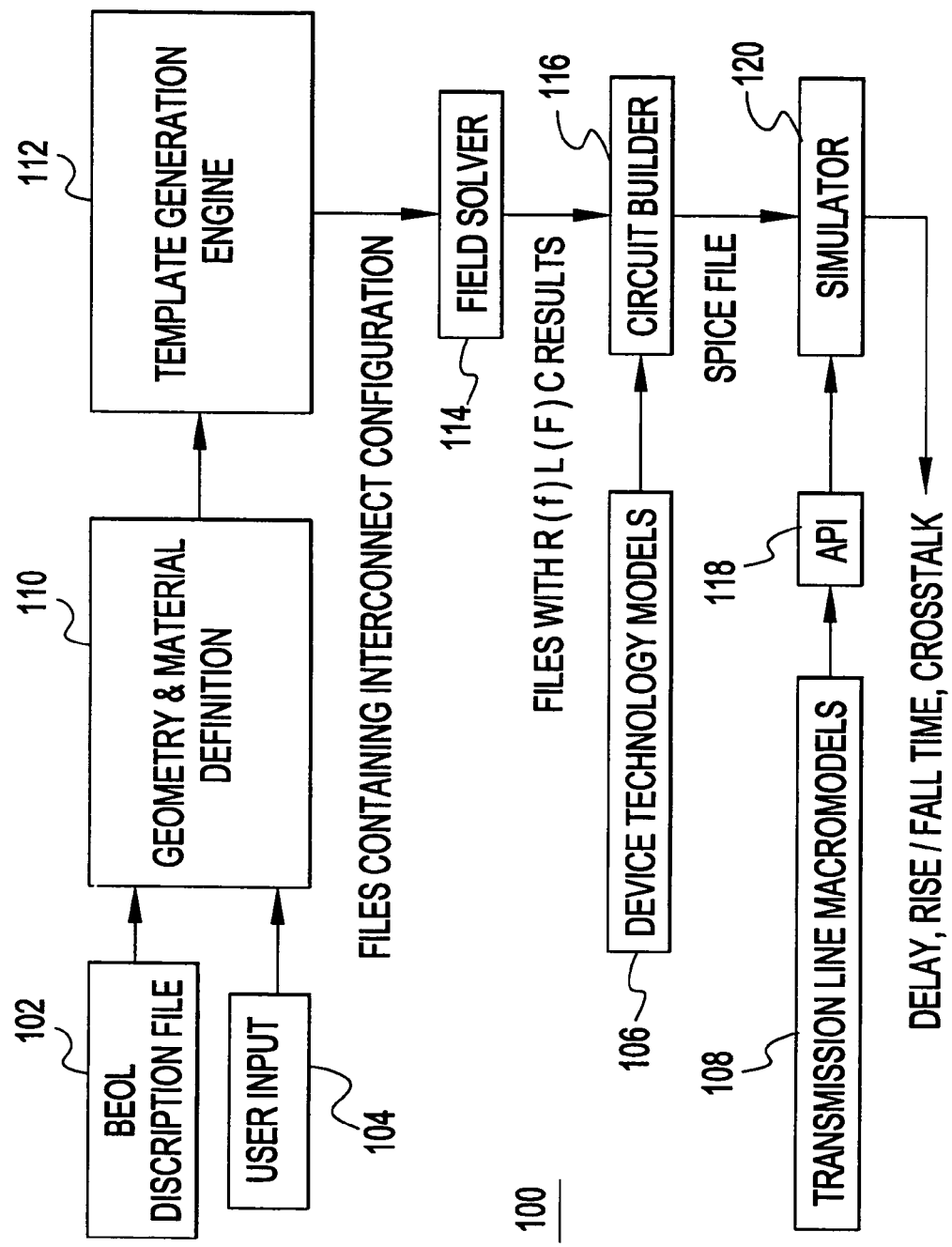
FIG. 1 shows a block diagram of an example of a fully automated computer aided design (CAD) system with wideband characterization of on-chip interconnect structures according to a preferred embodiment of the present invention.

Turning now to the drawings and, more particularly, FIG. 1 shows a block diagram of an example of a fully automated computer aided design (CAD) system 100 with wide-band characterization of on-chip interconnect structures according to a preferred embodiment of the present invention. As with any state of the art CAD system, a preferred embodiment system runs on a typical state of the art general purpose computer, such as for example a main frame computer, a scientific workstation, or a suitably equipped personal computer. Similarly, CAD modules may be distributed over a number of computers, each running one or more design module and the data files, such as for example, process parameter data and the like. The data files may be stored locally, e.g., on a personal computer, or stored remotely on a server with the process data being provided to, and being accessed by, individual modules as required. Further, a general purpose computer, main frame computer server, scientific workstation and personal computer are used for example only and not intended as a limitation. A preferred CAD system may be in any suitable computer system or collection thereof with sufficient capacity and storage for simulating and designing a particular circuit design.

Process variation selection is provided in a back end of the line (BEOL) description file 102, which may be altered interactively, e.g., through a graphical user interface (GUI) as displayed on a computer monitor (not shown). A user input file 104 (e.g., a collection of files, interactively input through the GUI, or both) includes interconnect parameter selections in addition to normal circuit topography and operating parameters. Device (transistor, junction capacitance and etc.) models are contained within a device technology model file 106 and transmission line loads are selected, defined and modeled in a transmission line macromodel file 108. The BEOL description file 102 and user input file 104 are inputs to a geometry and material definition module 110. The geometry and material definition module 110 combines selections from the BEOL description file 102 and user input file 104 to generate an interconnect configuration. A template generation engine 112 receives the interconnect configuration from the material definition module 110 and generates individual interconnect definitions for a circuit being simulated. A field solver 114 generates a transient interconnect model, e.g., a three dimensional (3D) interconnect model. A circuit builder 116 combines device models from device technology model file 106 with the interconnect model to generate a complete circuit model, e.g., a Spice simulation input file. Transmission line macromodels 108 pass through application program interface (API) 118 to a simulator 120. Simulator 120 simulates the complete circuit driving a load provided by the transmission line macromodels 108. Simulator results 122 may be provided in a printout or displayed at the GUI.

Figure 2A:
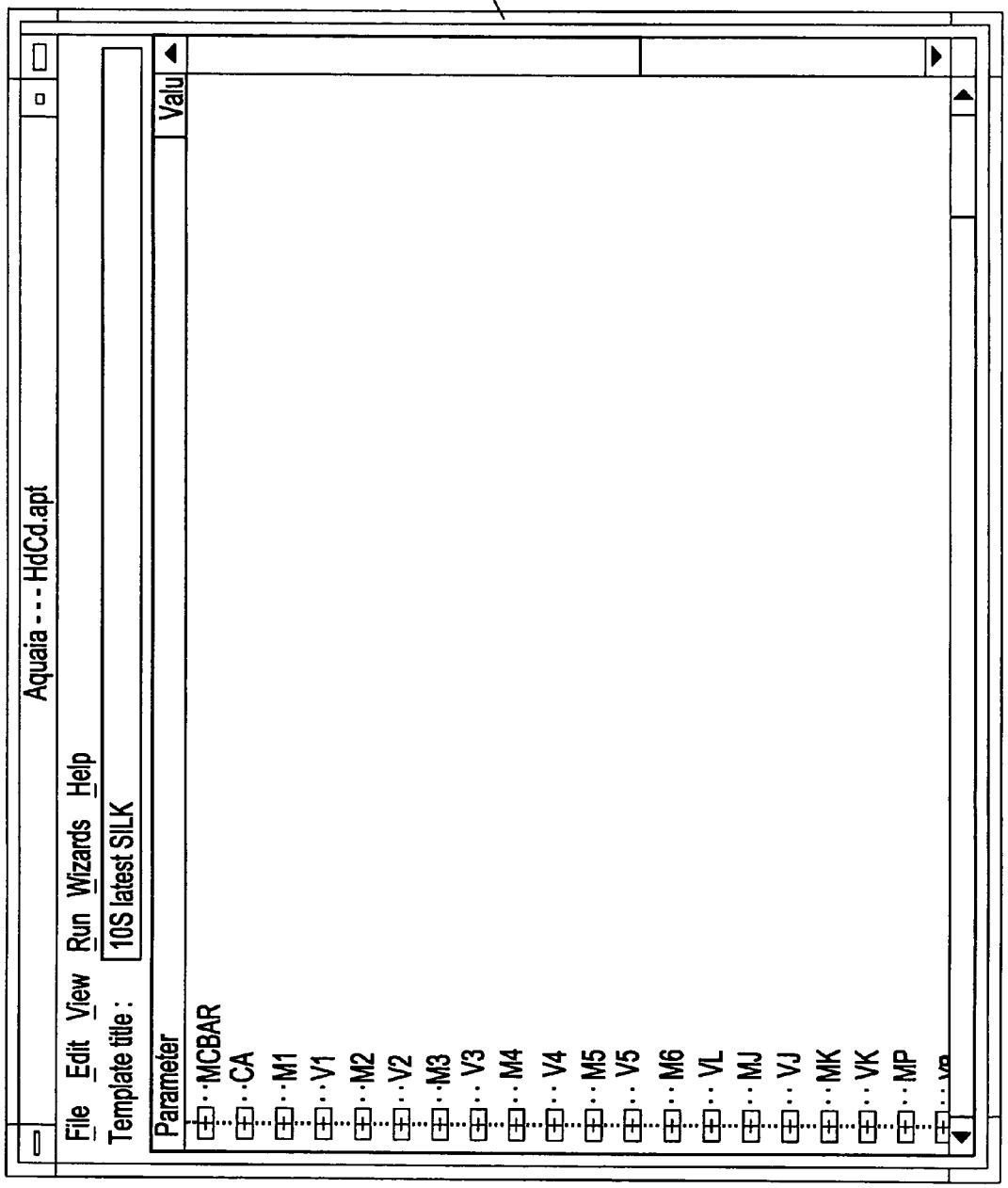
FIGS. 2A–B shows an example of screenshots for a graphical user interface (GUI) to the back end of the line (BEOL) wiring description file for specifying interconnect layer parameter selections.
Figure 2B:
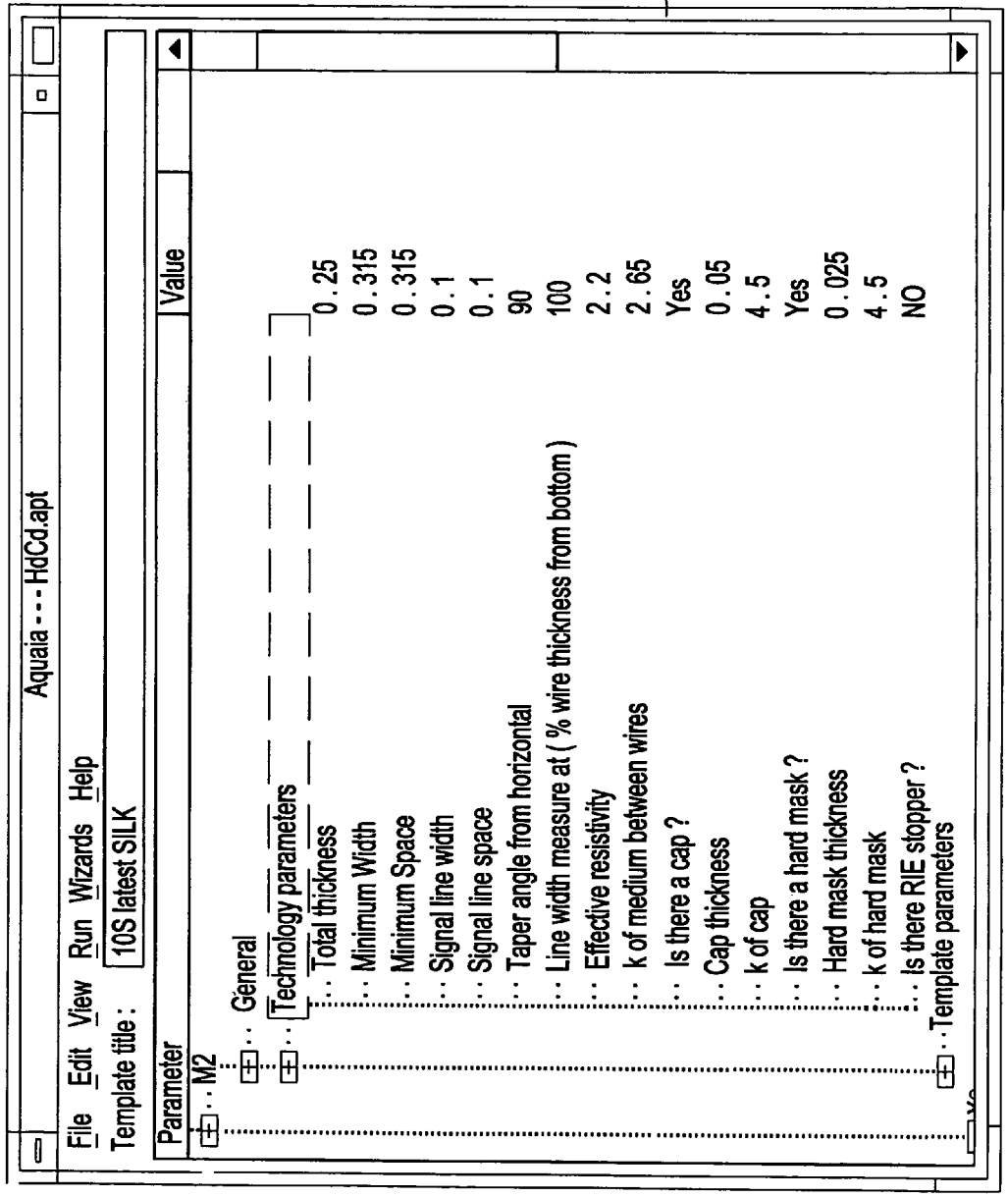

FIGS. 2A–B shows an example of GUI screenshots to the BEOL description file for specifying interconnect layer parameter selections. The BEOL description file defines the BEOL process under consideration and can be shared by designers and technologists during process development. FIG. 2A shows a screenshot 130 for selecting each of the alternating interconnect wiring (e.g., MCBAR, M1, M2, M3, M4 M5, M6, MJ, MK, MP) and dielectric/via (e.g., CA, V1, V2, V3, V4 V5, VL, VJ, VK, VP) layers for individual parametric definition. FIG. 2B shows a screenshot 132 with an example of technology parameters, for a selected metal (M2) layer in this example, that may be individually specified at each simulation run. In this example, metal line characteristics are defined by effective line resistivity and by total line thickness and line to line parameters, e.g., space, minimum width, signal line width and space, taper angle (of the line sidewalls), a line width measure. Line capacitance characteristics include dielectric or insulator relative dielectric constant between lines at that level; whether the layer is capped and, if so, the cap thickness and the relative dielectric constant of the cap material may be specified; whether a hard mask is included above the metal layer (e.g., as a via etch stop for the next superimposed dielectric layer) may be selected and, if so, its relative dielectric constant and thickness defined; whether a reactive ion etch (RIE) is being used to etch the next dielectric layer. Of course, signal space and line taper also affect capacitance calculations. Similarly, whether a conductor is in the presence of a magnetic material or if the conductive material exhibits magnetic properties or other parameters affecting inductance may be provided through another interface panel (not shown).

Figure 3B:
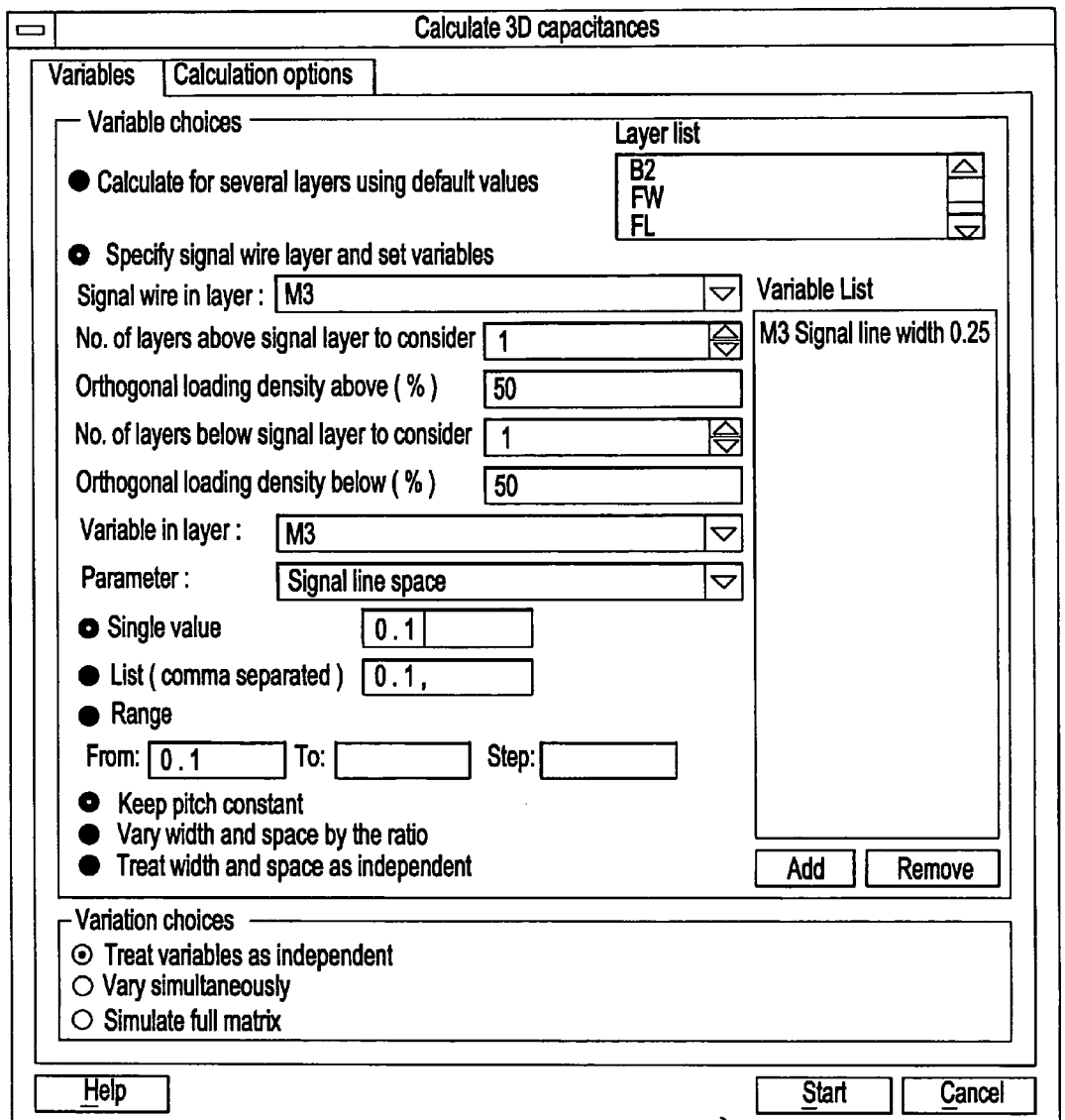

FIGS. 3A–B show screenshots 134, 136 of panel examples for 2D and 3D capacitance parameter selection, respectively, with similar parameters selection capability available for inductance parameters. As can be seen from the 2D example 134, default values can be used or values can be individually selected and varied. Also, a variation range can be selected for each of the physical or geometric interconnect structure parameters. Selectable physical parameters may include dielectric constants and metal resistivity. Selectable geometric parameters may include wire width, thickness and wire-to-wire spacing. Similarly, default values can be used or individually varied for the 3D example 136 as well. Optionally, metal density (e.g., larger than wires on minimum spacing or minimum wires on wider than minimum spacing) in the layers below and above the metal layer under consideration may be interactively defined.

FIGS. 4A–B show screenshots 138, 140 of panel examples for 2D and 3D templates, respectively, and FIG. 4C shows an example of a capacitance calculation results screenshot panel 138. The 2D screenshot 138 shows an example of a 2D template configuration calculation generated by the template generation engine (e.g., 112 in FIG. 1) for 2D per unit length capacitance and/or inductance calculation. In this 2D example, top layer signal lines 144 have power/ground mesh lines 146 on either side as well as below the signal wires 144. Extending the power/ground mesh lines 146 in parallel with and around the signal lines 144 is necessary for capturing wide-band frequency behavior of the inductance and, especially, resistance of the signal wires 144. The 3D interconnect configuration template, such as the example shown in 3D screenshot 140 and also generated by the template generation engine 112, may be used for 3D inductance and capacitance calculation. Such 3D templates can be combined with 2D templates that include multiple dielectric layers and that together provide very accurate capacitance calculation with minimal CPU run times. The field solver module 114 may apply any suitable field solver to 2D and 3D templates, e.g., such as is described in U.S. Pat. No. 6,418,401 entitled "Efficient Method For Modeling Three-Dimensional Interconnect Structures For Frequency-Dependent Crosstalk Simulation" to Dansky et al., assigned to the assignee of the present invention and incorporated herein by reference. Thus, the template generation engine 112 in combination with a field solver 114, such as Dansky et al., provides a capability that, previously, could only be done by experts in the field, i.e., correctly defining the power/ground mesh configuration needed for an accurate calculation. As a result, as can be seen from the calculation results in the example 142 of FIG. 4C, a capacitance matrix may be generated for individual wires with per unit capacitance values at each overlying wiring layer (e.g., M1, M2, M3, M4 M5, M6, MJ, MK, MP) as well as for terminal layer wires (fat wires). Moreover, 2D broadband R(f) and L(f) calculations are efficiently combined with 3D RL calculation at one very high frequency to obtain the full wide-band response with very short CPU run times.

Figure 5A:
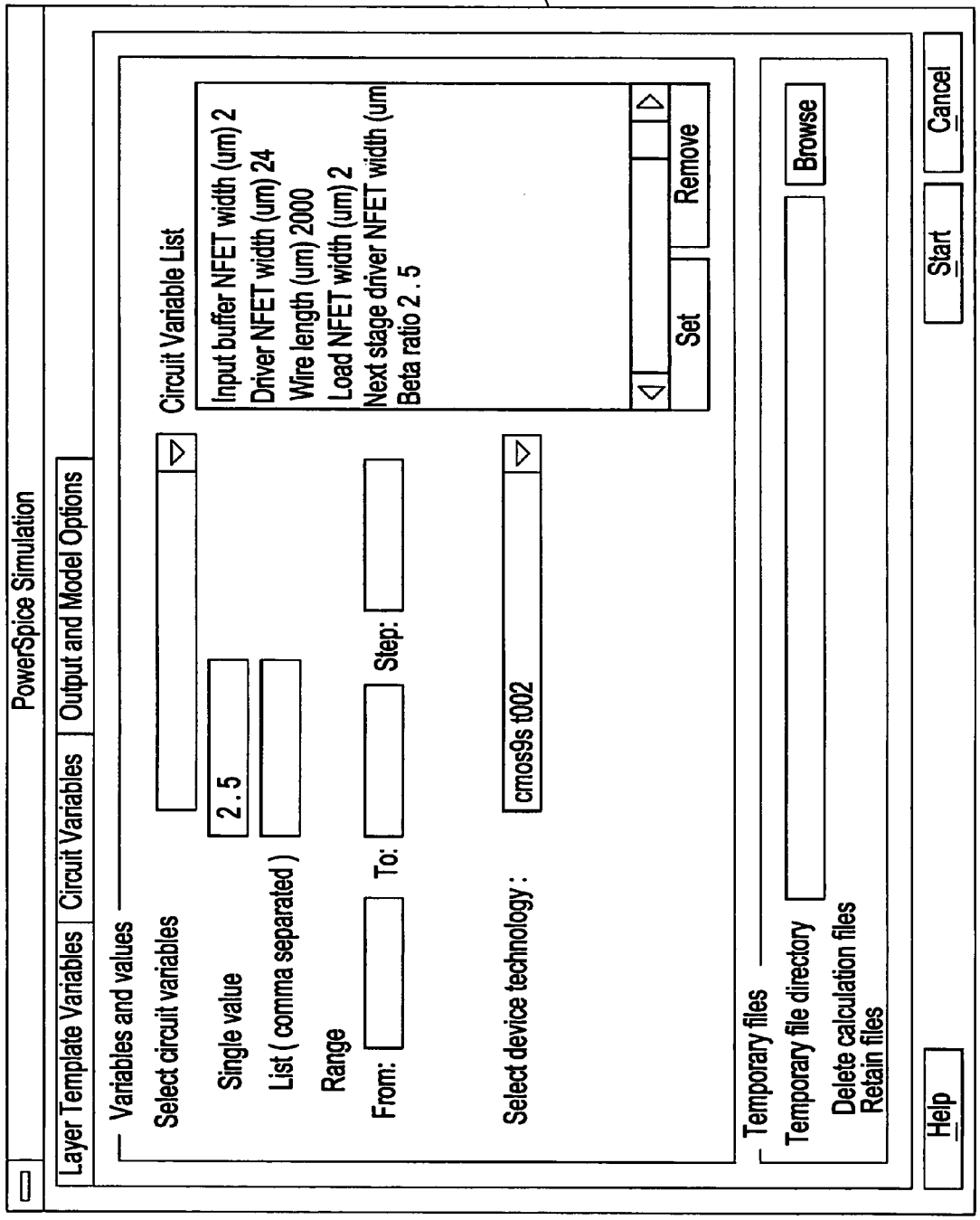
FIGS. 5A–B show screenshot GUI panel examples for selecting technology model inputs to the device technology model and the circuit builder modules.
Figure 5B:
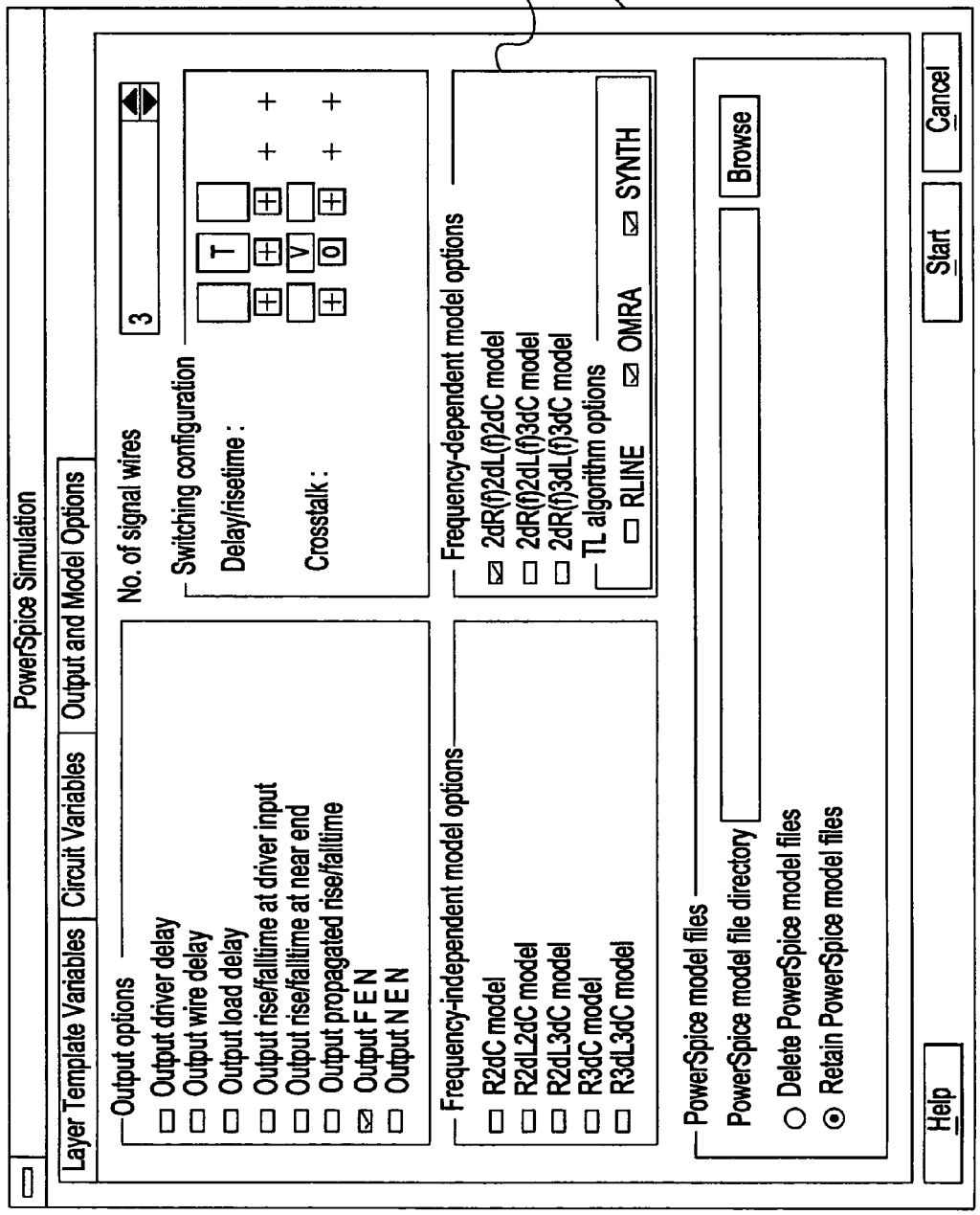
Figure 6A:
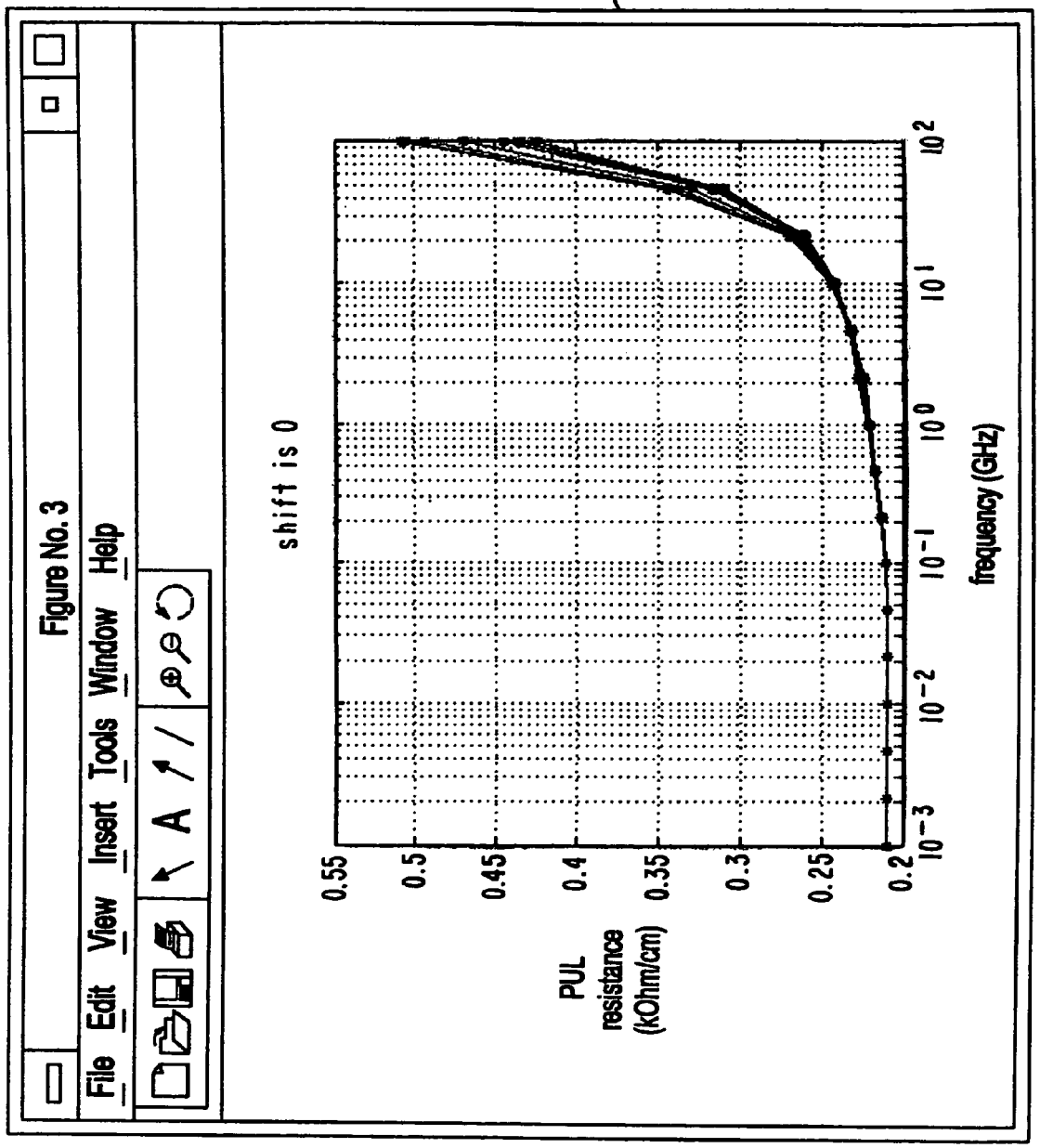
FIGS. 6A–B show screenshot examples of per-unit-length resistance and inductance frequency dependencies.
Figure 6B:
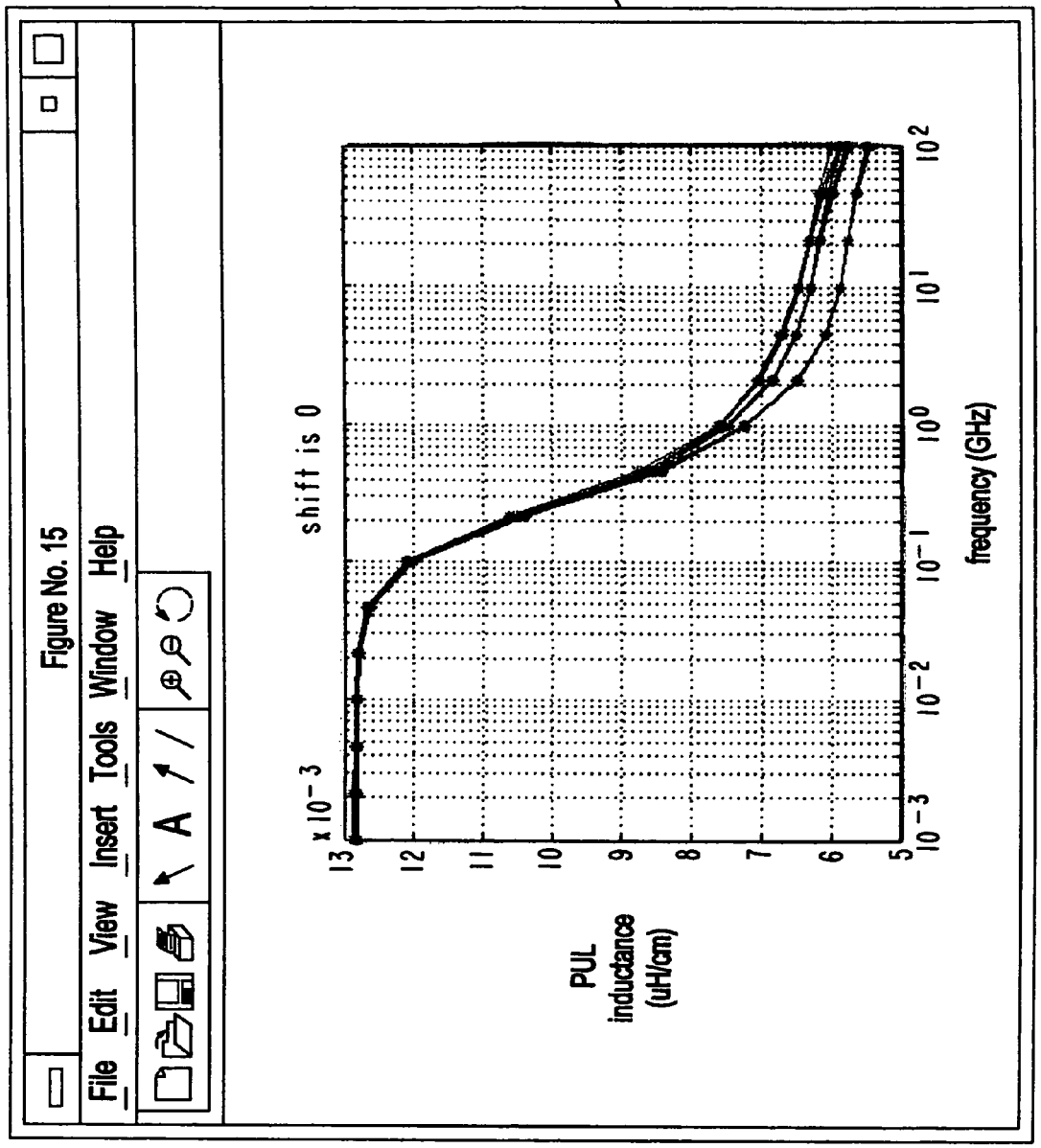

FIGS. 5A–B show screenshots 150, 152 of GUI panel examples for selecting technology model inputs to, and outputs from, the device technology model and circuit builder modules, e.g., 106 and 116 in FIG. 1. In the first example 150, a designer can provide device parameters for nonlinear drivers and receivers bounding the interconnect structure. Circuit variables, for example, can include connect device widths (e.g., input buffer, output driver and load devices), driver beta ratio (i.e., essentially, the ratio of driver pull up and pull down devices) and connect wire length. Optionally, the results can be compared or run for different technologies for comparing circuit performance in those technologies. In the example of GUI screenshot 152, the designer can select different interconnect model outputs, as well as both frequency dependent and frequency independent model options. A typical such data bus model may support a number of data bus signal lines, e.g., 12, and provide frequency dependent extraction options 153, e.g., for 2D capacitance and wideband 2D R(f)L(f) and transmission line simulation options (e.g., selecting between different macromodels for multiconductor transmission line simulation such as RLINE, OMRA, and SYNTH). Frequency-dependent model options 153 such as the F2dR(f)2dL(f)3dC and F2dR(f)3dL(f)3DC models combine 2D and 3D results in a single transmission line model to improve 2D accuracy without compromising the CAD tool runtime. Optionally, wire model netlists can be provided for integration into a verification flow. FIGS. 6A–B show GUI screenshots 154, 156 examples of bus per-unit-length resistance and inductance frequency dependencies, respectively, over 5 orders of magnitude, i.e., 1 MHz to 100 GHz.

Figure 7:
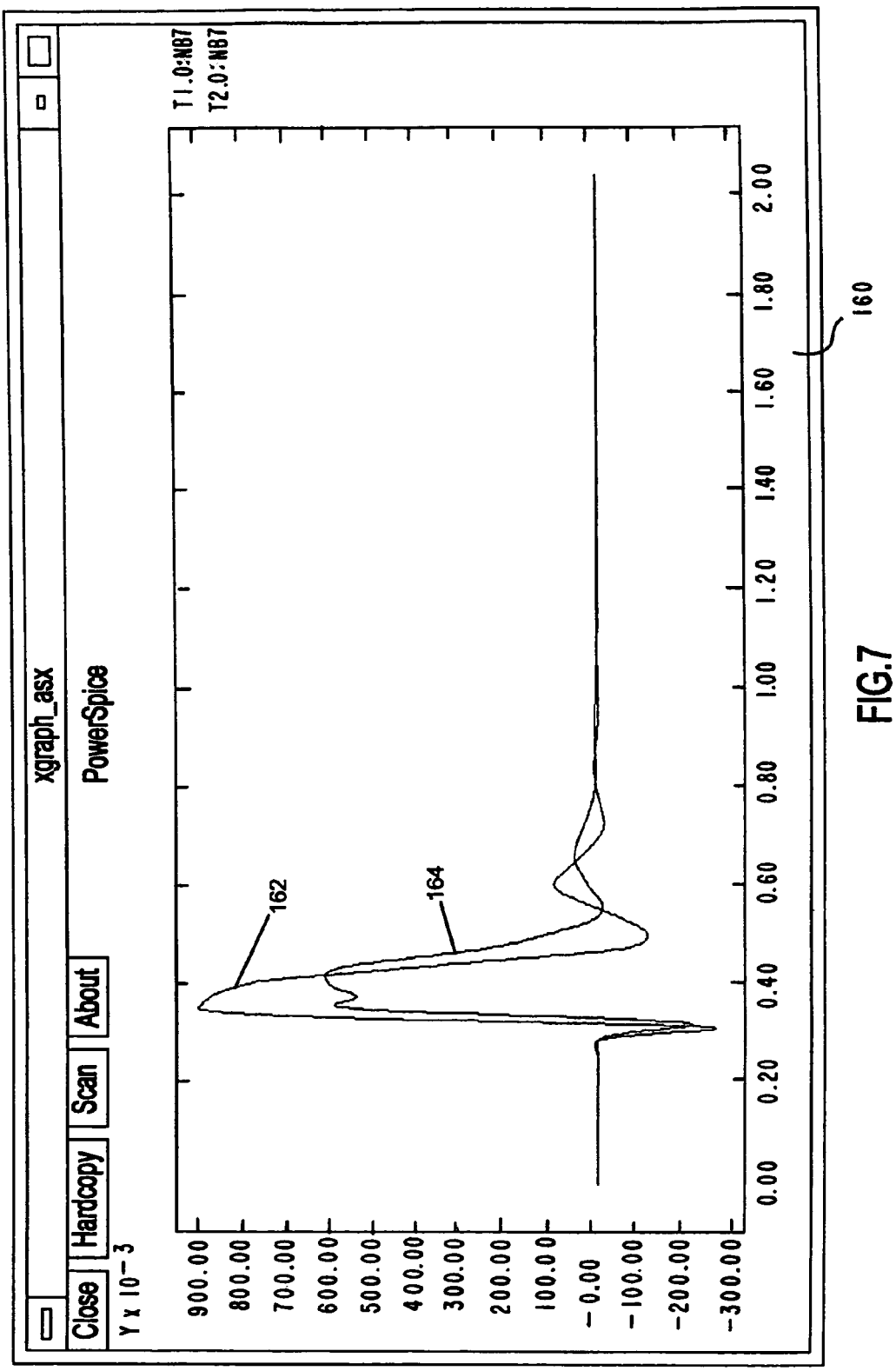
FIG. 7 shows a circuit simulator output screenshot example.

Finally, FIG. 7 shows an example of a GUI screenshot 160 of a circuit simulator output, e.g., 122 in FIG. 1, showing the results of electromagnetic coupling from neighboring active nets into a quiet net. In this example, output voltage waveforms 162, 164 compare two different interconnect models. As this example shows, the frequency-independent model 162 overestimates peak noise.

Advantageously, the present invention provides a user-friendly, reliable computing environment that facilitates characterizing and optimizing interconnect structures, especially on-chip BEOL wiring structures. Technologists and designers are graphically interfaced to a full BEOL stack description for modeling and analyzing on-chip wiring structures. This full BEOL stack description may be embodied in a data file that can be created, shared, viewed, and edited through a GUI by any tool user. Further, since each data file is common to a particular technology definition, designers can evaluate circuit performance in planned semiconductor technologies as the technologies are being defined.

In addition, the present invention improves evaluating, modeling, designing, and verifying electrical circuit interconnects for a broad range of applications, especially for microprocessors, application specific integrated circuits (ASICs), radio frequency circuits, and semiconductor memories. Further the present invention does not require a domain expert to generate electrical circuit interconnects models. So, designers can evaluate electrical circuit interconnects over a very wide band of operating frequencies. Correspondingly, technologists can graphically evaluate how process options and parameter changes affect circuit electrical parameters. Process data may be formatted to allow semiconductor process engineers to accurately access IC interconnect structure performance parameters, such as wire delay, slew, and crosstalk. Thus, semiconductor process engineers can tune the semiconductor process parameters to meet specific electrical performance criteria. As a result, circuit interconnects models are consistent and accurate over whole regions of interconnect parameter space. Circuit netlists can be generated for simulation based on an equivalent synthesized circuit representation of the frequency-dependent behavior. The netlists may be parameterized netlists in a format suitable for other CAD tools. Thus, the present invention provides a single tool with three technology facets seamlessly integrated into a graphical interface. The single tool includes electrical wiring structure parameter extraction with three-dimensional full wave electromagnetic analysis, nonlinear circuit simulation, and on-chip transmission line modeling.

While the invention has been described in terms of preferred embodiments, those skilled in the art will recognize that the invention can be practiced with modification within the spirit and scope of the appended claims.

What is claimed is:

1. A computer aided design (CAD) system for designing high performance circuits, said CAD system comprising:
    a graphical user interface (GUI) having input fields including conductor and dielectric input fields;
    a template generation engine interfaced with said GUI and generating multi-dimensional templates from interconnect configuration files; and
    a field solver using conductor and dielectric inputs guided by said multi-dimentional templates to determine circuit interconnection electric parameters.

2. A CAD system as in claim 1, wherein said input fields are geometric and property specification input fields.

3. A computer aided design (CAD) system comprising:
    a template generation engine generating templates from interconnect configuration files;
    a field solver generating broadband passive element relationships from said templates;
    a circuit builder generating circuit description files from device technology models and said broadband passive element relationships; and
    a simulator simulating circuit responses for transmission line models from said circuit description files.

4. A CAD system as in claim 3, further comprising:
    a geometry and material definition module receiving process description and generating said interconnect configuration files.

5. A CAD system as in claim 4, wherein process inputs are varied in said process description through a graphical user interface (GUI).

6. A CAD system as in claim 5, wherein conductor geometric and property specifications and dielectric geometric property specifications for interconnect wiring layers are provided to said GUI.

7. A CAD system as in claim 5, wherein said interconnect configuration files include two dimensional inductance templates and three dimensional per unit capacitance values for interconnect wiring layers.

8. A CAD system as in claim 5, wherein templates include two dimensional (2D) inductance templates and three dimensional (3D) capacitance templates.

9. A CAD system as in claim 8 wherein said 2D inductance templates and 3D capacitance templates are combined to provide multiple dielectric stack inclusion in capacitance calculation.

10. A CAD system as in claim 5, wherein said broadband passive relationships include frequency dependent resistance and inductance for selected signal conductors.

11. A CAD system as in claim 5 wherein two dimensional and three dimensional resistance and inductance templates are combined to provide wide-band circuit parameters.

12. A CAD system as in claim 5 wherein said template generation engine generates two dimensional (2D) broadband inductance templates for lines in a first layer, said 2D broadband inductance templates including far reference conductors in said first layer and in at least each of a layer above and below said first layer.

13. A CAD system as in claim 5 wherein said template generation engine generates three dimensional (3D) templates for capacitance calculation in a signal layer, said 3D templates including variable orthogonal wiring density in layers above and below said signal layer.

14. A CAD system as in claim 5, wherein said GUI displays simulated said circuit responses.

15. A CAD system for designing high performance circuits, said CAD system comprising:
- a graphical user interface (GUI) having input fields including conductor and dielectric input fields;
- a geometric conductor configuration module combining said conductor and dielectric field inputs, said geometric conductor configuration module producing an interconnect structure representation bounded by electromagnetic boundary conditions; and
- a field solver using produced said interconnect structure and the electromagnetic boundary conditions to determine interconnection structure parameters.

16. A CAD system as in claim 15, wherein said input fields are geometric and property specification input fields.

17. A CAD system, as in claim 16, wherein said geometric conductor configuration module produces a two dimensional (2D) conductor representation.

18. A CAD system, as in claim 17, wherein said 2D conductor representation is a 2D capacitive representation.

19. A CAD system, as in claim 18, wherein said 2D capacitive representation further includes a conductance representation of dielectric properties.

20. A CAD system, as in claim 19, wherein said 2D representation process is a 2D inductive representation.

21. A CAD system, as in claim 20, wherein said 2D inductive representation further includes a resistive representation of conductors and dielectric properties.

22. A CAD system, as in claim 21, wherein said 2D inductive representation further includes frequency dependent inductance effects.

23. A CAD system, as in claim 22, wherein the frequency dependent inductance effects include skin effects, proximity effects and return path proximity effects.

24. A CAD system, as in claim 23, wherein said geometric conductor configuration module produces a three dimensional (3D) conductor representation.

25. A CAD system, as in claim 24, wherein said 3D conductor representation is a 3D capacitive representation.

26. A CAD system, as in claim 24, wherein, said 3D conductor representation is a 3D inductive representation.

27. A CAD system as in claim 24 that generates circuit netlists for simulation, said netlists providing an equivalent synthesized circuit based representation of frequency-dependent net behavior.

28. A CAD system as in claim 24 that generates parameterized netlists.

* * * * *